US011678470B2

United States Patent
Do et al.

(10) Patent No.: US 11,678,470 B2
(45) Date of Patent: *Jun. 13, 2023

(54) THERMALLY-CONDUCTIVE ELECTROMAGNETIC INTERFERENCE (EMI) ABSORBERS WITH SILICON CARBIDE

(71) Applicant: Laird Technologies, Inc., Chesterfield, MO (US)

(72) Inventors: Hoang Dinh Do, Canton, MA (US); Robert Howard Boutier, Jr., Westport, MA (US); Jason L. Strader, Cleveland, OH (US); Michael S. Plante, Grafton, MA (US)

(73) Assignee: Laird Technologies, Inc., Chesterfield, MO (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/577,265

(22) Filed: Jan. 17, 2022

(65) Prior Publication Data

US 2022/0142020 A1     May 5, 2022

Related U.S. Application Data

(63) Continuation of application No. 14/928,189, filed on Oct. 30, 2015, now Pat. No. 11,229,147, which is a continuation-in-part of application No. 14/683,870, filed on Apr. 10, 2015, now abandoned.

(60) Provisional application No. 62/112,758, filed on Feb. 6, 2015.

(51) Int. Cl.
     *C09D 5/14*      (2006.01)
     *H05K 9/00*      (2006.01)
     *C09K 5/14*      (2006.01)

(52) U.S. Cl.
     CPC ............. *H05K 9/0081* (2013.01); *C09K 5/14* (2013.01); *H05K 9/0083* (2013.01)

(58) Field of Classification Search
None
See application file for complete search history.

(56) References Cited

U.S. PATENT DOCUMENTS

| | | | |
|---|---|---|---|
| 4,671,896 A | 6/1987 | Hasegawa et al. | |
| 4,963,291 A | 10/1990 | Bercaw | |
| 5,241,453 A | 8/1993 | Bright et al. | |
| 5,827,445 A | 10/1998 | Yoshida et al. | |
| 6,037,397 A | 3/2000 | Satoh et al. | |
| 6,514,428 B2 | 2/2003 | Suzuki et al. | |
| 6,844,393 B2 | 1/2005 | Goto et al. | |
| 6,866,908 B2 | 3/2005 | Lichtenstein et al. | |
| 6,962,753 B1 | 11/2005 | Yoshida | |
| 7,018,701 B2 | 3/2006 | Yamada et al. | |
| 7,094,822 B2 | 8/2006 | Sagal et al. | |
| 7,135,643 B2 | 11/2006 | van Haaster et al. | |
| 7,208,192 B2 | 4/2007 | Bunyan et al. | |
| 7,317,618 B2 | 1/2008 | Robinson et al. | |
| 7,417,078 B2 | 8/2008 | Fujiki et al. | |
| 7,463,496 B2 | 12/2008 | Robinson et al. | |
| 7,488,901 B2 | 2/2009 | Arnold | |
| 7,491,899 B2 | 2/2009 | Zuehlsdorf et al. | |
| 7,550,097 B2 | 6/2009 | Tonapi et al. | |
| 7,589,147 B2 | 9/2009 | Kawata et al. | |
| 7,608,326 B2 | 10/2009 | Johnson | |
| 7,623,360 B2 | 11/2009 | English et al. | |
| 7,722,957 B2 | 5/2010 | Achenbach et al. | |
| 7,842,381 B2 | 11/2010 | Johnson | |
| 8,187,490 B2 | 5/2012 | Tabei et al. | |
| 8,221,645 B2 | 7/2012 | Tabei et al. | |
| 8,641,928 B2 | 2/2014 | McBain | |
| 8,952,272 B2 | 2/2015 | Malek et al. | |
| 8,952,503 B2 | 2/2015 | Brodsky et al. | |
| 9,260,645 B2 | 2/2016 | Bruzda | |
| 9,611,414 B2 | 4/2017 | Timmerman et al. | |
| 9,629,283 B2 | 4/2017 | Soong et al. | |
| 10,150,902 B2 | 12/2018 | Kato et al. | |
| 10,648,750 B2 | 5/2020 | Esseghir et al. | |
| 10,892,204 B2 | 1/2021 | Kumura et al. | |
| 11,229,147 B2 * | 1/2022 | Do ...................... | H05K 9/0083 |
| 2002/0158332 A1 | 10/2002 | Masayuki | |

(Continued)

FOREIGN PATENT DOCUMENTS

| | | |
|---|---|---|
| CN | 102985510 A | 3/2013 |
| CN | 105304308 A | 2/2016 |

(Continued)

OTHER PUBLICATIONS

International Search Report and Written Opinion dated Jun. 13, 2016 for PCT Application No. PCT/US2016/014736 filed Jan. 25, 2016 which claims priority to the instant application, 13 pages.

European Search Report for EP Application No. 16746968.3 that claims priority to the same parent application as the instant application; dated Jan. 3, 2018, 4 pages.

Office Action dated Sep. 19, 2018 issued by the United States Patent and Trademark Office for U.S. Appl. No. 14/683,870 which lists the same inventors as the instant application but is not related through a priority claim; 13 pages.

Final Office Action for U.S. Appl. No. 14/683,870 which is the parent application to the instant application; dated Apr. 24, 2019, 18 pages.

First Chinese Office Action from Chinese Application No. 201680006672.0 which claims priority to the instant application, dated Jun. 3, 2019, 15 pages.

(Continued)

*Primary Examiner* — Sheeba Ahmed
(74) *Attorney, Agent, or Firm* — Harness, Dickey & Pierce, P.L.C.; Anthony Fussner

(57) ABSTRACT

According to various aspects, exemplary embodiments are disclosed of thermally-conductive EMI absorbers that generally includes thermally-conductive particles, EMI absorbing particles, and silicon carbide. The silicon carbide is present in an amount sufficient to synergistically enhance thermal conductivity and/or EMI absorption. By way of example, an exemplary embodiment of a thermally-conductive EMI absorber may include silicon carbide, magnetic flakes, manganese zinc ferrite, alumina, and carbonyl iron.

31 Claims, 7 Drawing Sheets

(56) References Cited

U.S. PATENT DOCUMENTS

| | | | |
|---|---|---|---|
| 2004/0054029 A1* | 3/2004 | Fujiki | H05K 9/0083 523/137 |
| 2007/0230131 A1 | 10/2007 | Bunyan et al. | |
| 2008/0012103 A1 | 1/2008 | Foster et al. | |
| 2009/0016025 A1 | 1/2009 | Johnson | |
| 2010/0140565 A1 | 6/2010 | Kim et al. | |
| 2010/0301261 A1 | 12/2010 | Chiang | |
| 2012/0080639 A1 | 4/2012 | Bruzda et al. | |
| 2012/0228018 A1 | 9/2012 | McBain | |
| 2014/0182924 A1 | 7/2014 | Misra et al. | |
| 2014/0231973 A1 | 8/2014 | Huang et al. | |
| 2016/0017231 A1 | 1/2016 | Singh et al. | |
| 2016/0233173 A1 | 8/2016 | Do et al. | |
| 2016/0234981 A1 | 8/2016 | Do et al. | |
| 2017/0198188 A1 | 7/2017 | Ishihara et al. | |
| 2017/0227304 A1 | 8/2017 | Esseghir et al. | |
| 2019/0375939 A1 | 12/2019 | Wei et al. | |
| 2022/0093525 A1 | 3/2022 | Bruzda et al. | |
| 2022/0267563 A1 | 8/2022 | Mezzanotti et al. | |

FOREIGN PATENT DOCUMENTS

| | | | |
|---|---|---|---|
| CN | 103554921 B | 6/2016 | |
| EP | 0866649 A1 | 9/1998 | |
| EP | 0896031 A2 | 2/1999 | |
| EP | 0945916 A2 | 9/1999 | |
| EP | 1146085 A1 | 10/2001 | |
| EP | 1860929 A1 | 11/2007 | |
| EP | 2897164 A1 | 7/2015 | |
| EP | 3546509 A1 | 10/2019 | |
| EP | 3817535 A1 | 5/2021 | |
| GB | 2460288 A | 11/2009 | |
| JP | S62257967 A | 11/1987 | |
| JP | H04352498 A | 12/1992 | |
| JP | H07207160 A | 8/1995 | |
| JP | H1027682 A | 1/1998 | |
| JP | H11116807 A | 4/1999 | |
| JP | H11116820 A | 4/1999 | |
| JP | 11-340673 | 12/1999 | |
| JP | 2001358265 A | 12/2001 | |
| JP | 3944741 B2 * | 7/2007 | |
| JP | 3944741 B2 | 7/2007 | |
| JP | 3949612 B2 | 7/2007 | |
| JP | 4070714 B2 | 4/2008 | |
| JP | 4280200 B2 | 6/2009 | |
| JP | 4463390 B2 | 5/2010 | |
| JP | 4764220 B2 | 8/2011 | |
| JP | 5512923 B2 | 6/2014 | |
| JP | 5894612 B2 | 3/2016 | |
| JP | 2019085482 A | 6/2019 | |
| KR | 101358440 B1 | 2/2014 | |
| KR | 101544587 B1 | 8/2015 | |
| KR | 101549986 B1 | 9/2015 | |
| KR | 101607677 B1 | 4/2016 | |
| TW | I222459 | 10/2004 | |
| TW | 202108674 A | 3/2021 | |
| WO | WO-2012026466 A1 | 3/2012 | |
| WO | WO-2015023001 A1 | 2/2015 | |
| WO | WO-2016077683 A1 | 5/2016 | |
| WO | WO-2016126449 A1 | 8/2016 | |
| WO | WO-2019046154 A1 | 3/2019 | |

OTHER PUBLICATIONS

Common knowledge 1: "Production and Use of Three Important Components in Continuous Casting: Monoblock stopper, Long Nuzzle and Submerged Nozzle", Sep. 2007, 2 pages.

Common Knowledge 2: Shi, Yang, "Refrigeration Technique", Ed., China Light Industry Press, Edition 1, p. 158; Sep. 2007. 2 pages.

Silicon Carbide Materials Properties data dated 2013 downloaded from http://accuratus.com/silicar.html on Jun. 21, 2017.

Aluminum Oxide Materials Properties data dated 2013 downloaded from http://accuratus.com/alumox.html on Jun. 21, 2017.

Meshram et al., Characterization of ferrite and silicon carbide based microwave absorber using FSS structures at X-band, Indian Journal of Radio & Space Physics, vol. 34, Feb. 2005, pp. 71-74.

Gutmann et al. (Sintered Silicon Carbide: A New Ceramic Vessel Material for Microwave Chemistry in Single-Mode Reactors, Chem. Eur. J. 20105b4, 16, 12182-12194. (Year: 2010).

Oxford English Dictionary—putty definition, third edition, 2007, 12 pages. (Year: 2007).

Oxford English Dictionary—Pad definition, Oxford University Press, second edition, 1989, 10 pages. (Year: 1989).

Thermal & EMI Dual Function Sheet EMPV2 Series; Kitagawa Industries America, Inc.; http://kgs-ind.com/wp-content/uploads/products/pdf/EMPV2-Thermal-Pad+EMI-- Dual-function-sheet.pdf; Jul. 31, 2013; 1 pg.

3M AB 6000HG Hybrid Type EMI Absorber; 3M Electronics Markets Materials Division; http://www.tewipack.de/de/aktuelles/img/3MAB6200HGDataSheet.pdf- ; Sep. 30, 2015; 3 pgs.

Non-Final Office Action dated Sep. 19, 2018 issued by the United States Patent and Trademark Office for U.S. Appl. No. 14/683,870 which is the parent application to the instant application, 13 pages.

* cited by examiner

THERMALLY-CONDUCTIVE ELECTROMAGNETIC INTERFERENCE (EMI) ABSORBERS WITH SILICON CARBIDE

CROSS-REFERENCE TO RELATED APPLICATIONS

This patent application is also a continuation of U.S. patent application Ser. No. 14/928,189 filed Oct. 30, 2015 (published as US2016/0234981 on Aug. 11, 2016 and issuing as U.S. Pat. No. 11,229,147 on Jan. 18, 2022).

U.S. patent application Ser. No. 14/928,189 claims the benefit of and priority to U.S. Provisional Patent Application No. 62/112,758 filed Feb. 6, 2015.

U.S. patent application Ser. No. 14/928,189 is a continuation-in-part of U.S. patent application Ser. No. 14/683,870 filed Apr. 10, 2015 (published as US2016/0233173 on Aug. 11, 2016).

U.S. patent application Ser. No. 14/928,189 also claimed the benefit of and priority to U.S. Provisional Patent Application No. 62/112,758 filed Feb. 6, 2015.

The entire disclosures of the above applications are incorporated herein by reference.

FIELD

The present disclosure generally relates to thermally-conductive electromagnetic interference (EMI) absorbers.

BACKGROUND

This section provides background information related to the present disclosure which is not necessarily prior art.

Electrical components, such as semiconductors, transistors, etc., typically have pre-designed temperatures at which the electrical components optimally operate. Ideally, the pre-designed temperatures approximate the temperature of the surrounding air. But the operation of electrical components generates heat which, if not removed, will cause the electrical component to operate at temperatures significantly higher than its normal or desirable operating temperature. Such excessive temperatures may adversely affect the operating characteristics of the electrical component and the operation of the associated device.

To avoid or at least reduce the adverse operating characteristics from the heat generation, the heat should be removed, for example, by conducting the heat from the operating electrical component to a heat sink. The heat sink may then be cooled by conventional convection and/or radiation techniques. During conduction, heat may pass from the operating electrical component to the heat sink either by direct surface contact between the electrical component and heat sink and/or by contact of the electrical component and heat sink surfaces through an intermediate medium or thermal interface material (TIM). The thermal interface material may be used to fill the gap between thermal transfer surfaces, in order to increase thermal transfer efficiency as compared to having the gap filled with air, which is a relatively poor thermal conductor.

In addition to generating heat, the operation of electronic devices generates electromagnetic radiation within the electronic circuitry of the equipment. Such radiation may result in electromagnetic interference (EMI) or radio frequency interference (RFI), which can interfere with the operation of other electronic devices within a certain proximity. Without adequate shielding, EMI/RFI interference may cause degradation or complete loss of important signals, thereby rendering the electronic equipment inefficient or inoperable.

A common solution to ameliorate the effects of EMI/RFI is through the use of shields capable of absorbing and/or reflecting and/or redirecting EMI energy. These shields are typically employed to localize EMI/RFI within its source, and to insulate other devices proximal to the EMI/RFI source.

The term "EMI" as used herein should be considered to generally include and refer to EMI emissions and RFI emissions, and the term "electromagnetic" should be considered to generally include and refer to electromagnetic and radio frequency from external sources and internal sources. Accordingly, the term shielding (as used herein) broadly includes and refers to mitigating (or limiting) EMI and/or RFI, such as by absorbing, reflecting, blocking, and/or redirecting the energy or some combination thereof so that it no longer interferes, for example, for government compliance and/or for internal functionality of the electronic component system.

SUMMARY

This section provides a general summary of the disclosure and is not a comprehensive disclosure of its full scope or all of its features.

According to various aspects, exemplary embodiments are disclosed of thermally-conductive EMI absorbers that generally includes thermally-conductive particles, EMI absorbing particles, and silicon carbide. The silicon carbide is present in an amount sufficient to synergistically enhance thermal conductivity and/or EMI absorption. By way of example, an exemplary embodiment of a thermally-conductive EMI absorber may include silicon carbide, magnetic flakes, manganese zinc ferrite, alumina, and carbonyl iron.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations and are not intended to limit the scope of the present disclosure.

FIG. 1 is a line graph illustrating attenuation or absorption (in decibels per centimeter (dB/cm)) versus frequency (in Gigahertz (GHz)) for two different thermally-conductive EMI absorbers including silicon carbide, carbonyl iron powder, and alumina according to exemplary embodiments, and also showing a thermally-conductive EMI absorber that does not include any silicon carbide for comparison purposes;

Figure 6:
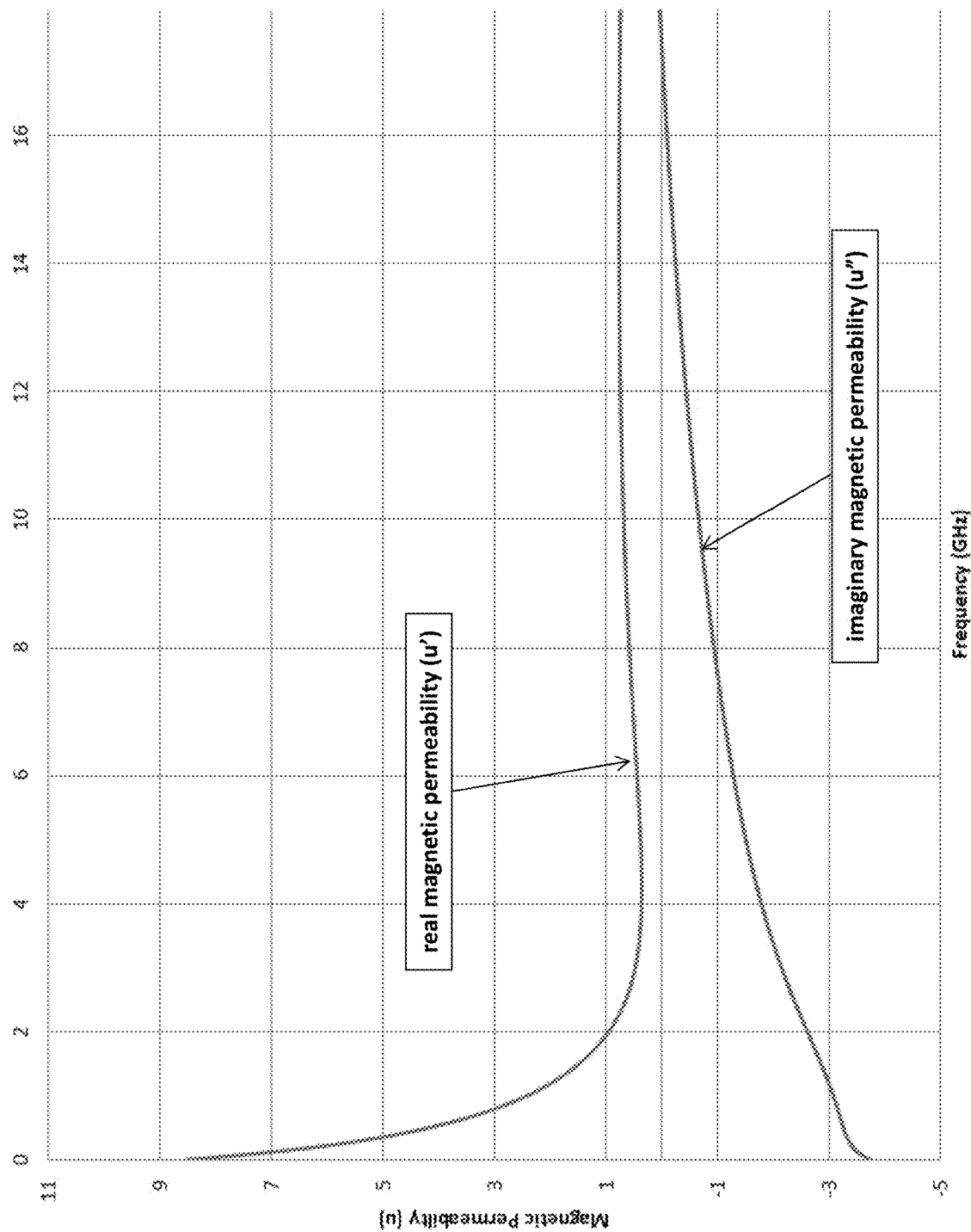
Figure 7:
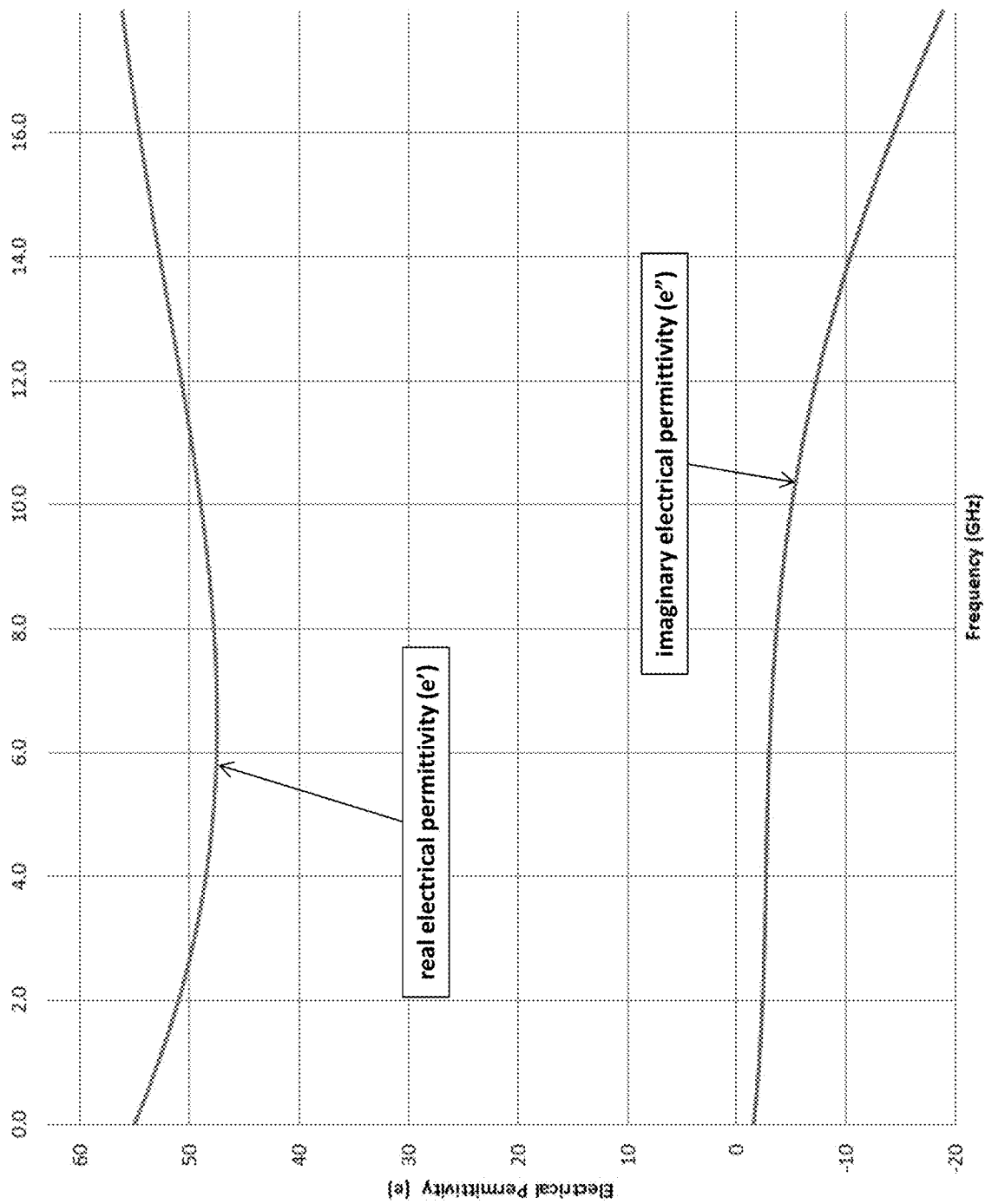

FIG. 6 is a line graph illustrating magnetic permeability (u) versus frequency (GHz) for a thermally-conductive EMI absorber including silicon carbide, carbonyl iron powder, alumina, manganese zinc (MnZn) ferrite, and magnetic flakes according to exemplary embodiments according to exemplary embodiments; and FIG. 7 is a line graph illustrating electrical permittivity (e) versus frequency (GHz) for a thermally-conductive EMI absorber including silicon carbide, carbonyl iron powder, alumina, manganese zinc (MnZn) ferrite, and magnetic flakes according to exemplary embodiments according to exemplary embodiments.

DETAILED DESCRIPTION

Example embodiments will now be described more fully with reference to the accompanying drawings.

Disclosed herein are exemplary embodiments of thermally-conductive EMI absorbers that include silicon carbide. For example, exemplary embodiments are disclosed of thermally-conductive EMI absorbers that include silicon carbide, carbonyl iron powder, and alumina. In some exemplary embodiments, a thermally-conductive EMI absorber may further include manganese zinc (MnZn) ferrite and magnetic flakes.

Figure 1:
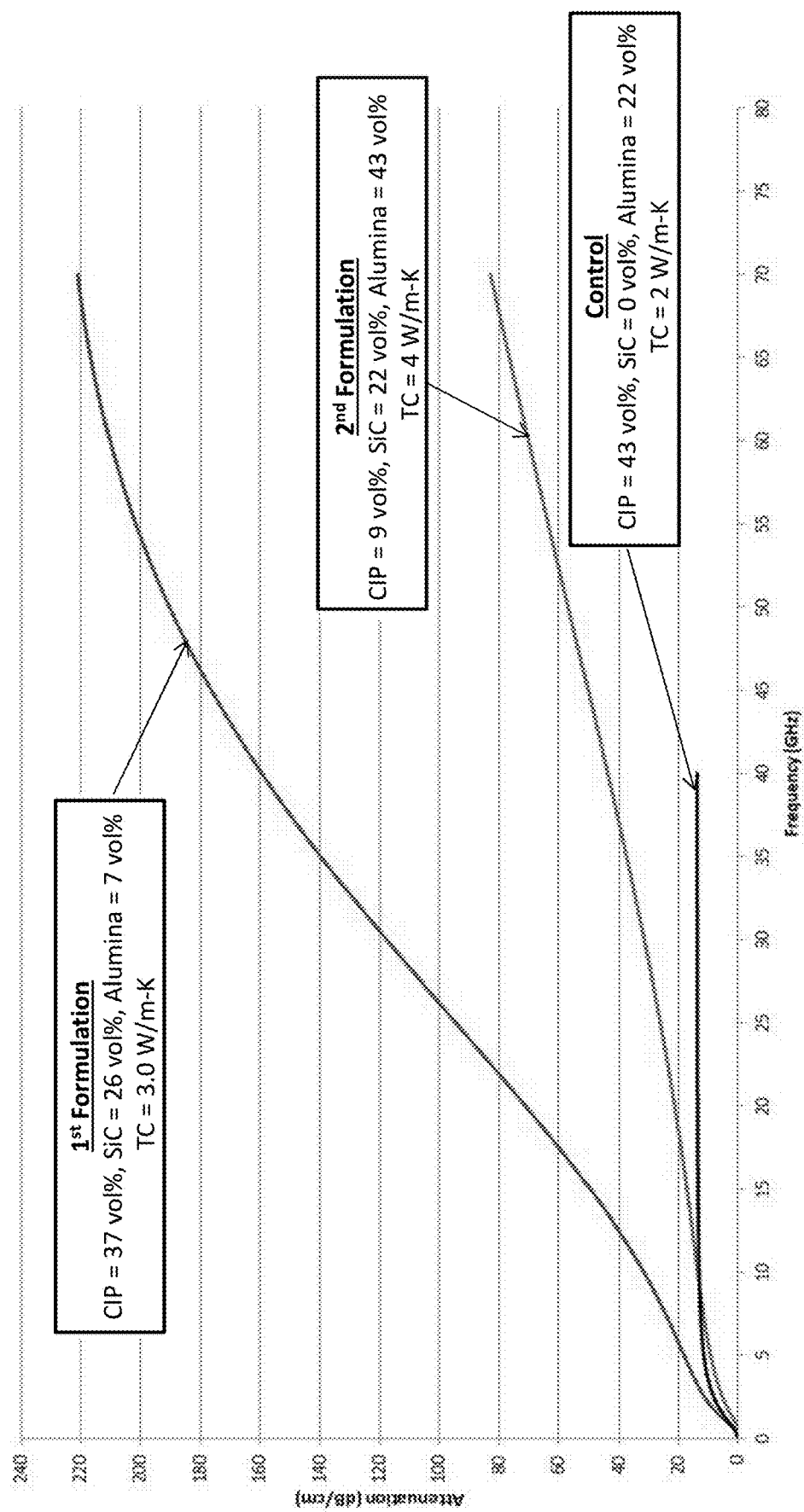
Figure 2:
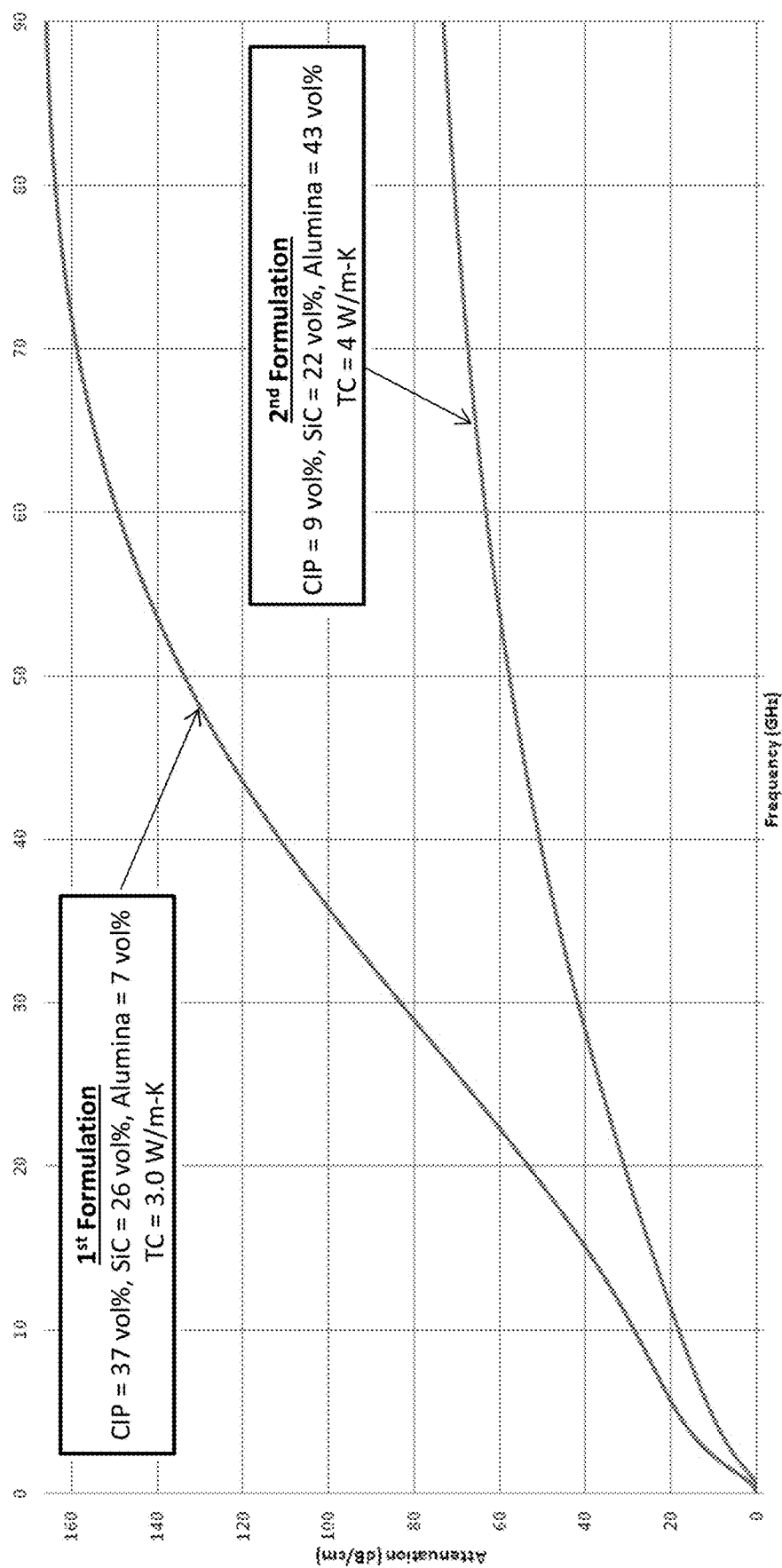
FIG. 2 is a line graph illustrating attenuation (dB/cm) versus frequency (GHz) for two different thermally-conductive EMI absorbers including silicon carbide, carbonyl iron powder, and alumina according to exemplary embodiments.
Figure 5:
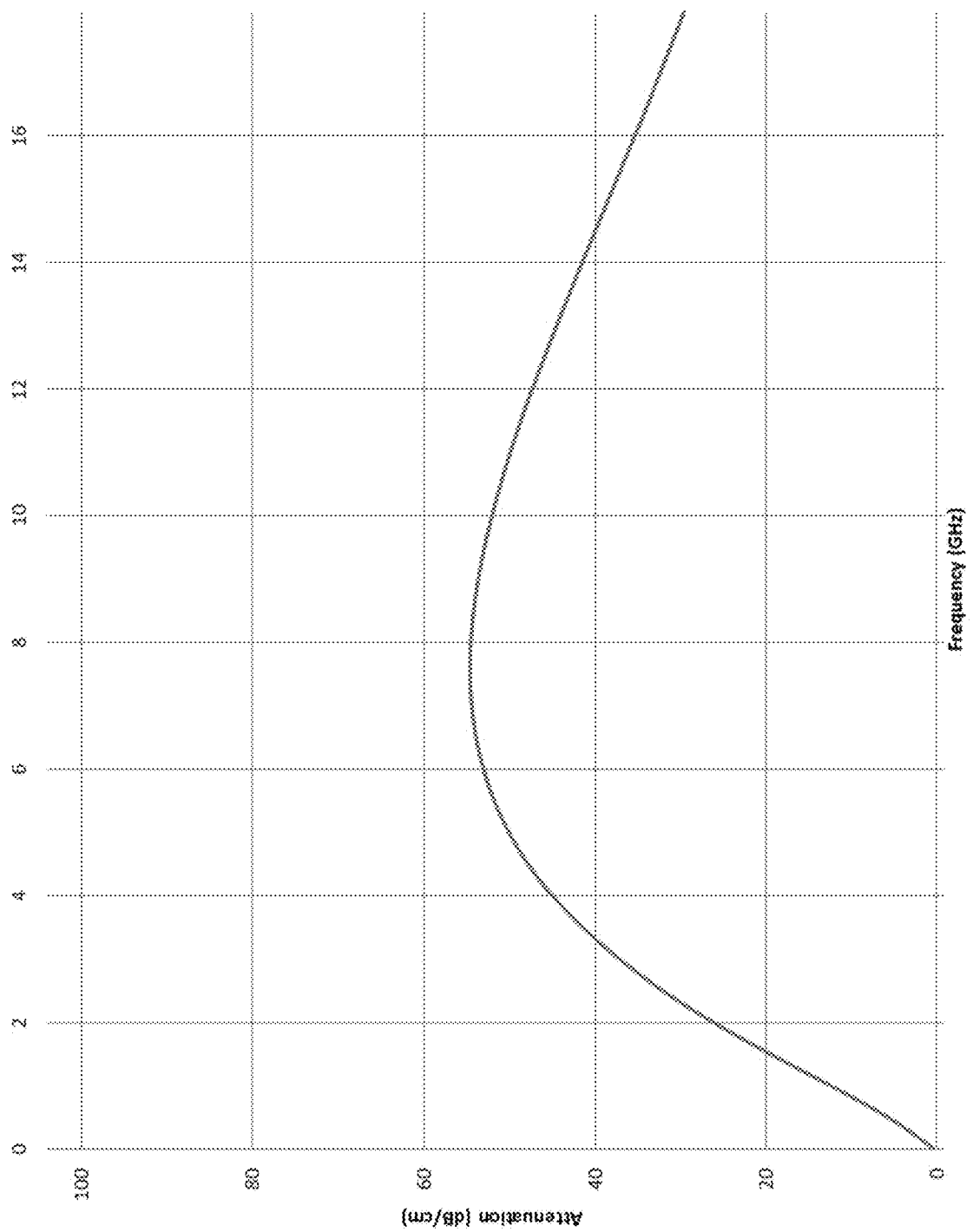
FIG. 5 is a line graph illustrating attenuation (dB/cm) versus frequency (GHz) for a thermally-conductive EMI absorber including silicon carbide, carbonyl iron powder, alumina, manganese zinc (MnZn) ferrite, and magnetic flakes according to exemplary embodiments according to exemplary embodiments.

As disclosed herein, the inventors have discovered that silicon carbide (SiC) works synergistically with the thermally-conductive materials (e.g., Alumina ($Al_2O_3$), ceramics, etc.) and EMI absorbing materials (e.g., carbonyl iron powder (CIP), magnetic flakes, manganese zinc (MnZn) ferrite, other EMI absorbing materials, etc.) to enhance both thermal conductivity and EMI absorption (e.g., as shown in FIGS. 1, 2, and 5, etc.). The resulting thermally-conductive EMI absorbers have high thermal conductivity (e.g., at least 2 Watts per meter per Kelvin (W/m-K) or higher, etc.) and high EMI absorption or attenuation (e.g., at least 9 decibels per centimeter (dB/cm) at a frequency of at least 1 GHz, at least 17 dB/cm at a frequency of at least 15 GHz, etc.). By way of example only, exemplary embodiments are disclosed herein of thermally-conductive EMI absorbers that may include silicon carbide (e.g., about 21 to 27 volume percent (vol %), etc.), carbonyl iron powder (e.g., about 8 to 38 vol %, etc.), and alumina (e.g., about 6 to 44 vol %, etc.). By way of further example only, exemplary embodiments are also disclosed herein of thermally-conductive EMI absorbers that may include silicon carbide (e.g., about 4 to 10 vol %, etc.), carbonyl iron powder (e.g., about 3 to 5 vol %, etc.), alumina (e.g., about 18 to 23 vol %, etc.), manganese zinc ferrite (e.g., about 27 to 40 vol %, etc.), and flaked magnetic material (e.g., about 2 to 4 vol %, etc.).

The art has not shown an instance where silicon carbide has acted synergistically to provide improved thermal conductivity and high EMI absorption. The following four examples show the synergistic effect that the silicon carbide has on the thermal conductivity and EMI absorption. From a practical point of view, a need in the art has been satisfied.

Through the presence of the synergy that the silicon carbide has on the alumina and carbonyl iron powder in the first three example formulations, the inventors have created a thermally-conductive EMI absorbing composition having better thermal conductivities with less alumina and/or better absorption with less carbonyl iron powder than the conventional absorbers. In the fourth example formulation, the presence of the manganese zinc ferrite and magnetic flakes along with the silicon carbide, alumina, and carbonyl iron powder provides a thermally-conductive EMI absorbing composition having exceptionally high attenuation at low frequencies, such as between 1 GHz and 5 GHz.

The following four example formulations are meant to illustrate the general principles and properties of certain embodiments and are not intended to limit the scope of the claims. The volume percents of each formulation may be varied in other exemplary embodiments to improve or optimize certain properties of the produce.

In these example formulations, the silicon carbide had a mean particle size of about 30 microns with particle sizes ranging from about 16 microns to about 49 microns. The silicon carbide particles were mostly spherical in shape. The range of particle sizes of one alumina particle was from about 1 micron to about 9 microns (e.g., with a mean particle size of about 2 microns, etc.). The range of particle sizes of the other or second alumina particle was from about 26 microns to about 65 microns (e.g., with a mean particle size of about 45 microns, etc.). The range of particle sizes for the carbonyl iron particles was from about 1 micron to about 6 microns. The silicon carbide, alumina, and carbonyl iron particles were all mostly spherical in shape.

A first example formulation of a thermally-conductive EMI absorber includes 37 volume percent of carbonyl iron powder, 26 volume percent of silicon carbide, 7 volume percent of alumina, 27.7 volume percent of silicone matrix, 2.2 volume percent of dispersant, and 0.1 volume percent of cross-linker. In this first example, the dispersant was Isopropyl triisostearoyl titanate, and the crosslinker was Methylhydrogensiloxane-Dimethylsiloxane copolymer, hydride terminated. This first example formulation had a thermal conductivity of 3 W/m-K.

A second example formulation of a thermally-conductive EMI absorber includes 9 volume percent of carbonyl iron powder, 22 volume percent of silicon carbide, 43 volume percent of alumina, 24.4 volume percent of silicone matrix, 1.5 volume percent of dispersant, and 0.1 volume percent of cross-linker. In this second example, the dispersant was Isopropyl triisostearoyl titanate, and the crosslinker was Methylhydrogensiloxane-Dimethylsiloxane copolymer, hydride terminated. This second example formulation had a thermal conductivity of 4 W/m-K.

A third example formulation of a thermally-conductive EMI absorber includes 10 volume percent of carbonyl iron powder, 27 volume percent of silicon carbide, 34 volume percent of alumina, 27.1 volume percent of silicone matrix, 1.8 volume percent of dispersant, and 0.1 volume percent of cross-linker. In this third example, the dispersant was Isopropyl triisostearoyl titanate, and the crosslinker was Methylhydrogensiloxane-Dimethylsiloxane copolymer, hydride terminated. This third example formulation had a thermal conductivity of 3.5 W/m-K.

FIGS. 1 and 2 are exemplary line graphs illustrating attenuation or absorption (dB/cm) versus frequency (GHz) for the first and second formulations described above. For comparison purposes, FIG. 1 also shows attenuation or absorption (dB/cm) versus frequency (GHz) for a conventional thermally-conductive EMI absorber (labeled control in FIG. 1) that does not include any silicon carbide. The results shown in FIGS. 1 and 2 are provided only for purposes of illustration and not for purposes of limitation.

The conventional absorber (control) included 43 volume percent of by volume of carbonyl iron powder, 0 volume percent of by volume of silicon carbide, 22 volume percent of by volume alumina, 33.1 volume percent of silicone matrix, 1.7 volume percent of dispersant, and 0.2 volume percent of cross-linker. For the control, the dispersant was Isopropyl triisostearoyl titanate, and the crosslinker was Methylhydrogensiloxane-Dimethylsiloxane copolymer, hydride terminated. The control had a thermal conductivity of 2 W/m-K.

As compared to the three sample formulations, the conventional absorber had the lowest thermal conductivity of 2 W/m-K. By comparison, the first formulation had a higher thermal conductivity of 3 W/m-K despite having less alumina of only 7% by volume. Thus, this shows the synergistic effect that the silicon carbide had on the thermal conductivity.

A shown in FIG. 1, the attenuation of the second formulation was better than the conventional absorber or control. This was despite the second formulation having only 9% by volume of carbonyl iron powder, as compared to the conventional absorber's 43% by volume of carbonyl iron powder. The second formulation also had a thermal conductivity of 4 W/m-K, which was double the thermal conductivity of the conventional absorber.

FIG. 1 also shows that the attenuation of the first formulation was better or higher than (e.g., about a threefold increase (3×), etc.) the conventional absorber. The first formulation also had a thermal conductivity of 3 W/m-K, which is higher than the conventional absorber's thermal conductivity of 2 W/m-K.

A fourth example formulation of a thermally-conductive EMI absorber includes 32.1 volume percent manganese zinc ferrite, 3 volume percent of flaked magnetic material (e.g., magnetic flakes or flaked alloy containing iron, silicon, and aluminum, etc.), 4 volume percent of carbonyl iron powder, 4.8 volume percent of silicon carbide, 4.1 volume percent of silicone oil, 1.6 volume percent of titanate coupling agent, 2.9 volume percent of 5.5 wt % cross-linker in silicone oil, 19.5 volume percent of alumina (e.g., 3.7 volume percent of a first type of grade of alumina having a mean particle size of about 2 microns, and 15.8 volume percent of a second type or grade of alumina having a mean particle size of about 45 microns, etc.), and 28 volume percent of silicone gel (or 14 volume percent of part A silicone gel, and 14 volume percent of part B silicone gel).

In terms of weight percent, the fourth example formulation included 47.7 weight percent of manganese zinc ferrite, 5.9 weight percent of flaked magnetic material, 9 weight percent of carbonyl iron powder, 4.5 weight percent of silicon carbide, 1.2 weight percent of silicon oil, 0.5 weight percent of titanate coupling agent, 0.8 weight percent of 5.5 wt % cross-linker in silicone oil, 22.5 weight percent of alumina (e.g., 4.5 weight percent of a first type of grade of alumina having a mean particle size of about 2 microns, and 18 weight percent of a second type or grade of alumina having a mean particle size of about 45 microns, etc.), and 8 weight percent of silicone gel (or 4 weight percent of part A silicone gel, and 4 weight percent of part B silicone gel).

Also in this fourth example formulation, the manganese zinc ferrite had a mean particle size of about 6.5 microns and an irregular spherical shape. The flaked magnetic material had a diameter of about 80 microns and a thickness of about 1 micron, thereby having an aspect ratio of about 80. The flaked magnetic material may comprise alloy containing iron, silicon, and aluminum, such as an alloy including about 6 to 12% of silicon, about 3 to 10% of aluminum, and iron in the remaining percentage (e.g., a magnetic metal alloy including about 85% iron, about 9.5% silicon, and about 5.5% aluminum, a magnetic metal alloy including about 85% iron, about 9% silicon, and about 6% aluminum etc.).

This fourth example formulation had a thermal conductivity of 2 W/m-K or more. This fourth example formulation also had an attenuation of at least about 9 decibels per centimeter for frequencies from 1 gigahertz to 6 gigahertz.

FIGS. 3 through 7 are exemplary line graphs illustrating performance data for thermally-conductive EMI absorbers having the fourth formulation described above. The results shown in FIGS. 3 through 8 are provided only for purposes of illustration and not for purposes of limitation.

Figure 3:
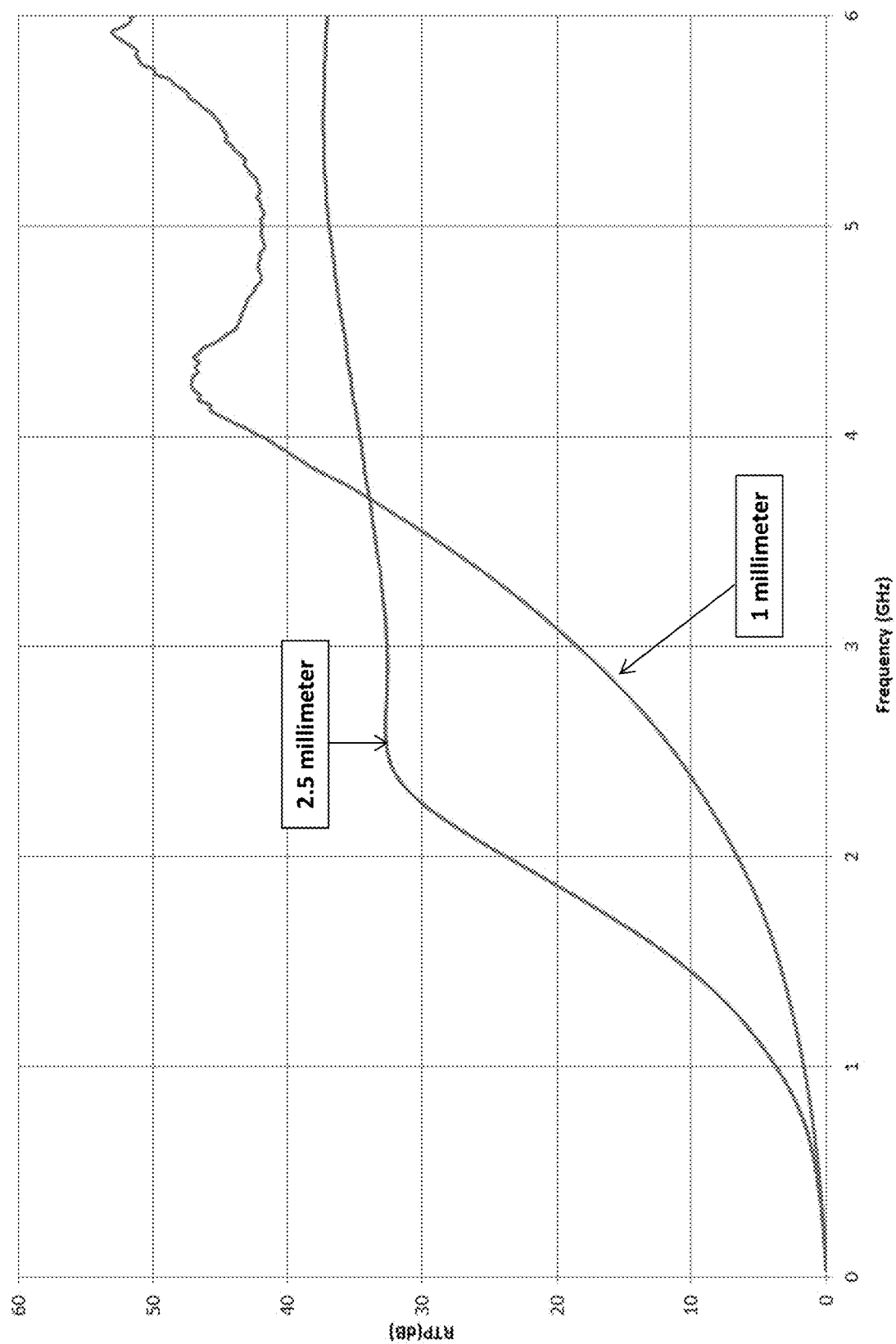
FIG. 3 is a line graph illustrating transmission attenuation ratio (RTP) (in decibels (dB)) versus frequency (GHz) for two thermally-conductive EMI absorbers including silicon carbide, carbonyl iron powder, alumina, manganese zinc (MnZn) ferrite, and magnetic flakes according to exemplary embodiments, where the thermally-conductive EMI absorbers had thicknesses of 1 millimeter (mm) and 2.5 mm.

More specifically, FIG. 3 is a line graph illustrating transmission attenuation ratio (RTP) (dB) versus frequency (GHz). Generally, FIG. 3 shows that the thermally-conductive EMI absorber having the fourth formulation had good RTP (e.g., greater than about 2 dB, etc.) for frequencies between 1 GHz and 6 GHz. By way of background, transmission attenuation ratio is a 50 ohm microstrip measurement based on IEC6233 where:

$$Rtp = -10 \; Log(10^{|S21|/10}|(1-10^{|S11|/10}))$$

Figure 4:
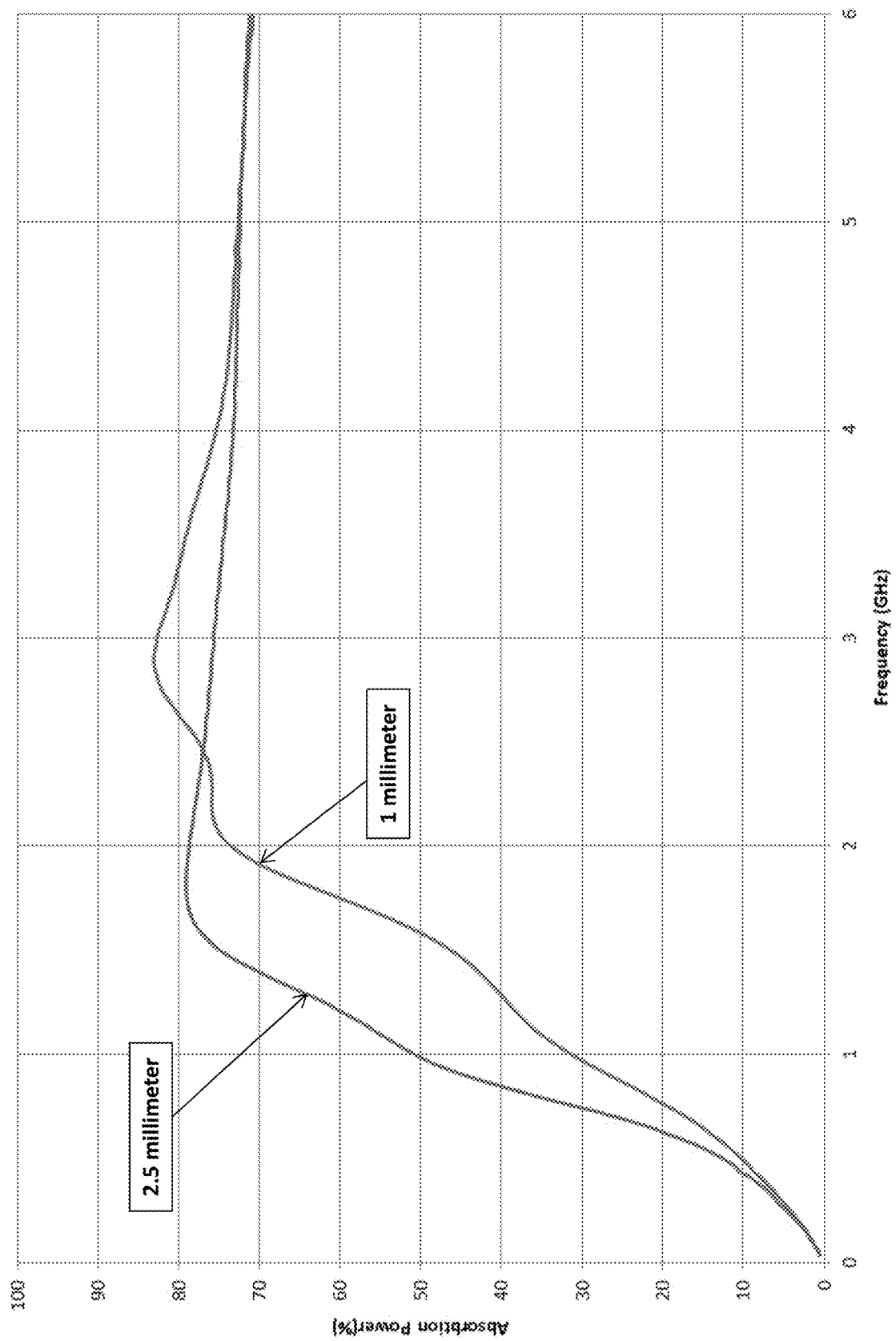
FIG. 4 is a line graph illustrating absorption power (%) versus frequency (GHz) for two thermally-conductive EMI absorbers including silicon carbide, carbonyl iron powder, alumina, manganese zinc (MnZn) ferrite, and magnetic flakes according to exemplary embodiments, where the thermally-conductive EMI absorbers had thicknesses of 1 mm and 2.5 mm.

1=>energy that you put in the line
S21=>energy passes thru the line
S11=>energy that is reflected FIG. 4 is a line graph illustrating absorption power (%) versus frequency (GHz). Generally, FIG. 4 shows that the thermally-conductive EMI absorber having the fourth formulation had good absorption power (%) (e.g., greater than 30%, etc.) for frequencies between 1 GHz and 6 GHz. For example, the 2.5 millimeter thick sample had an absorption power of at least about 50% at 1 GHz and greater than about 70% for frequencies between 2 GHz and 6 GHz. Also, for example, the 1 millimeter thick sample had an absorption power of at least about 30% at 1 GHz and greater than about 70% for frequencies between 2 GHz and 6 GHz.

FIG. 5 is a line graph illustrating attenuation (dB/cm) versus frequency (GHz). Generally, FIG. 5 shows that the thermally-conductive EMI absorber having the fourth formulation had good attenuation (e.g., greater than 9 dB/cm from 1 GHz to 6 GHz, etc.) for frequencies between 1 GHz and 18 GHz. For example, the thermally-conductive EMI absorber having the fourth formulation had an attenuation of at least about 11 dB/cm at 1 GHz, at least about 25 dB/cm at 2 GHz, at least about 36 dB/cm at 3 GHz, at least about 44 dB/cm at 4 GHz, at least about 49 dB/cm at 5 GHz, and at least about 52 dB/cm at 6 GHz.

FIGS. 6 and 7 are line graphs respectively illustrating magnetic permeability (u) and electrical permittivity (e) versus frequency (GHz) for the thermally-conductive EMI absorber having the fourth formulation. Generally, permeability and permittivity are measured and may then be entered into an equation to calculate attenuation, which reflects EMI absorption. A material with higher imaginary magnetic permeability (u") and higher imaginary electrical permittivity (e") will have a higher attenuation. Other properties of the material may also be derived from these four parameters, i.e., real magnetic permeability (u') and imaginary magnetic permeability (u") shown in FIG. 6, and the real electrical permittivity (e') and imaginary electrical permittivity (e") shown in FIG. 7.

FIGS. 6 and 7 show that the thermally-conductive EMI absorber having the fourth formulation had good magnetic permeability and electrical permittivity for frequencies between 1 GHz and 6 GHz.

Accordingly, exemplary embodiments are disclosed of thermally-conductive EMI absorbers having high EMI absorption or attenuation (e.g., at least 9 decibels per centimeter (dB/cm) at a frequency of at least 1 GHz, etc.) at low frequencies (e.g., from 1 GHz to 6 GHz, etc.) and high thermal conductivity (e.g., at least 2 W/mk or higher, etc.). The thermally-conductive EMI absorber may also have a high magnetic permeability (e.g., a magnetic permeability of 23 at 10 MHz, etc.). As disclosed herein, exemplary embodiments of thermally-conductive EMI absorbers may include a material (e.g., soft silicone gel, etc.) including silicon carbide, alumina, carbonyl iron powder, manganese zinc (MnZn) ferrite, and magnetic flakes or flaked magnetic materials (e.g., flaked Sendust magnetic metal powder, flaked permalloy, a flaked alloy containing iron, silicon, and aluminum, a flaked alloy containing iron and nickel, a flaked material having a relatively high permeability, etc.) for good heat transfer and microwave absorption.

By way of example, the magnetic flakes or flaked magnetic materials may comprise an alloy containing iron, silicon, and aluminum, such as an alloy including about 6 to 12% of silicon, about 3 to 10% of aluminum, and iron in the remaining percentage (e.g., a magnetic metal alloy including about 85% iron, about 9.5% silicon, and about 5.5% aluminum, a magnetic metal alloy including about 85% iron, about 9% silicon, and about 6% aluminum etc.), etc. By way of further example, the magnetic flakes or flaked magnetic materials may comprise an alloy containing iron and aluminum, such as a nickel-iron magnetic alloy including about 20% iron and about 80% nickel, etc. Also, by way of example, the thermally-conductive EMI absorber may be placed between a chip (or other heat source) and a heat sink (or other heat dissipating device or component) to conduct heat away and prevents (or at least inhibit) EMI energy from reaching the heat sink and radiating out. In which case, the thermally-conductive EMI absorber may allow for the elimination of a noise suppressor.

For EMI absorption or attenuation, each of first, second, and third sample formulations included carbonyl iron powder in the amounts of 37 vol %, 9 vol %, and 10 vol %, respectively. Advantageously, carbonyl iron powder offers better performance for frequencies of interest ranging from about 5 GHz to about 15 GHz. Other exemplary embodiments may include one or more other EMI absorbers instead of or in addition to carbonyl iron powder and/or in different amounts. For example, the fourth formulation also included manganese zinc ferrite and magnetic flakes or flaked alloy containing iron, silicon, and aluminum in addition to carbonyl iron powder. More specifically, the example fourth formulation included 32.1 volume percent manganese zinc ferrite, 3 volume percent of flaked magnetic material, and 4 volume percent of carbonyl iron powder. Other exemplary embodiments may include one or more other EMI absorbers instead of or in addition to manganese zinc ferrite, magnetic flakes, and/or carbonyl iron powder and/or in different amounts.

Examples of EMI absorbers that may be used in exemplary embodiments include iron silicide, iron particles, iron oxides, iron alloys, iron-chrome compounds, SENDUST, permalloy, ferrites, magnetic alloys, magnetic powders, magnetic flakes, magnetic particles, nickel-based alloys and powders, chrome alloys, carbonyl iron (e.g., carbonyl iron powder, etc.), combinations thereof, etc. The EMI absorbers may comprise one or more of granules, spheroids, microspheres, ellipsoids, irregular spheroids, strands, flakes, particles, powder, and/or a combination of any or all of these shapes. In some exemplary embodiments, the EMI absorber may comprise magnetic material, such as a magnetic material with a magnetic relative permeability greater than 2 at 1.0 Megahertz. For example, the EMI absorber may have a relative magnetic permeability greater than about 3.0 at approximately 1.0 Gigahertz, and greater than about 1.5 at 10 Gigahertz. Alternative embodiments may include EMI absorbers configured differently and in different sizes. These specific numerical values provided in this paragraph (as are all numerical values disclosed herein) are for purposes of illustration only and not for purposes of limitation.

For thermal conductivity, each of the first, second, third, and fourth example formulations included alumina in the amounts of 7 vol %, 43 vol %, 34 vol %, and 19.5 vol %, respectively. Advantageously, alumina is relatively low cost and is available in various particle sizes, which allows for nesting or packing of alumina particles to increase volume loading of the alumina for higher thermal conductivity. Other exemplary embodiments may include one or more other thermal conductors or thermally-conductive fillers instead of or in addition to alumina. For example, some exemplary embodiments may include other thermally-conductive fillers having a thermal conductivity of at least 1 W/m-K (Watts per meter-Kelvin) or more, such as a copper filler having thermal conductivity up to several hundred W/m-K, etc. Also, for example, other exemplary embodiments may include one or more of the following thermally-conductive fillers: zinc oxide, boron nitride, silicon nitride, aluminum, aluminum nitride, alumina, iron, metallic oxides, graphite, ceramics, combinations thereof (e.g., alumina and zinc oxide, etc.), etc. In addition, exemplary embodiments may also include different grades (e.g., different sizes, different purities, different shapes, etc.) of the same (or different) thermally-conductive fillers. For example, a thermally-conductive EMI absorber may include two different sizes of boron nitride. By varying the types and grades of thermally-conductive fillers, the final characteristics of the thermally-conductive EMI absorber (e.g., thermal conductivity, cost, hardness, etc.) may be varied as desired. In exemplary embodiments disclosed herein, the thermally-conductive EMI absorbers may have a thermal conductivity of at least 2 W/m-K or higher.

The first, second, third, and fourth example formulations included a silicone matrix (e.g., silicone elastomer, silicone gel, etc.). In other exemplary embodiments, the matrix may comprise other materials, such as other thermoset polymers including polyurethanes, rubber (e.g., SBR, nitrile, butyl, isoprene, EPDM, etc.), etc. By way of additional examples, the matrix material may comprise thermoplastic matrix materials, polyolefins, polyamides, polyesters, polyurethanes, polycarbonates, polystyrene and styrenic copolymers, acrylnitriles, polyvinyl chlorides, polysulfones, acetals, polyarlyates, polypropylenes, surlyns, polyethylene terephthalates, polystyrenes, combinations thereof, etc. The matrix may be selected based on the particular fillers (e.g., silicon carbide, alumina, carbonyl iron powder, manganese zinc ferrite, magnetic flakes, other fillers, etc.) and/or particular amounts of fillers that may be suspended or added to the matrix. The matrix may also be substantially transparent to electromagnetic energy so that the matrix does not impede the absorptive action of the EMI absorbing filler in the matrix. For example, a matrix exhibiting a relative dielectric constant of less than approximately 4 and a loss tangent of less than approximately 0.1 is sufficiently transparent to EMI. Values outside this range, however, are also contemplated as these specific numerical values provided in this paragraph (as are all numerical values disclosed herein) are for purposes of illustration only and not for purposes of limitation.

By way of example only, the following is a description of an exemplary process that may be used for making a thermally-conductive EMI absorber that includes silicon carbide, carbonyl iron powder, and alumina, such as a thermally-conductive EMI absorber having the first, second, or third example formulation described above. In a first step or operation, a high speed mixer may be used to mix silicone gel parts A and B, along with the dispersant and cross linker until well blended (e.g., mixing for about 2 minutes, etc.). In a second step or operation, carbonyl iron powder may then be slowly added while mixing (e.g., for about 5 minutes, etc.) until the carbonyl iron powder is well mixed and wetted with silicone polymer. In a third step or operation, silicon carbide may next be slowly added while mixing (e.g., for about 5 minutes, etc.) until well blended. In a fourth step or operation, alumina or aluminum oxide having a first or smaller particle size may be slowly added while mixing (e.g., for about 5 minutes, etc.) until well blended. In a fifth step or operation, alumina or aluminum oxide having a second or larger particle size may be slowly added while mixing (e.g., for about 5 minutes, etc.) until well blended. In a sixth step or operation, the mixing may be continued (e.g., for about 5 minutes, etc.) until the mixture is thoroughly smooth. In a seventh step or operation, the mixture may be placed under vacuum (e.g., for about 5 minutes, etc.) to remove air. An eighth step or operation may include setting a gap between calendering rolls for desired product thickness. In a ninth step or operation, the mixture may be rolled between two release liners in-between the calendering rolls. In a tenth step of operation, the resulting sheets may be cured in an oven, e.g., at 285 degrees Fahrenheit for about 1 to 2 hours depending on thickness, etc.

By way of further example only, the following is a description of an exemplary process that may be used for making a thermally-conductive EMI absorber that includes silicon carbide, carbonyl iron powder, alumina, manganese zinc ferrite, and magnetic flakes, such as a thermally-conductive EMI absorber having the fourth formulation described above. In a first step or operation, a mixer may be used to mix silicone gel parts A and B, along with a dispersant and cross linker until well blended (e.g., mixing for about 2 minutes, etc.). In a second step or operation, carbonyl iron powder may then be slowly added while mixing (e.g., for about 5 minutes, etc.) until the carbonyl iron powder is well mixed and wetted with silicone polymer. In a third step or operation, silicon carbide may next be slowly added while mixing (e.g., for about 5 minutes, etc.) until well blended. In a fourth step or operation, alumina or aluminum oxide having a first or smaller particle size may be slowly added while mixing (e.g., for about 5 minutes, etc.) until well blended. In a fifth step or operation, alumina or aluminum oxide having a second or larger particle size may be slowly added while mixing (e.g., for about 5 minutes, etc.) until well blended. In a sixth step or operation, manganese zinc ferrite may next be slowly added while mixing (e.g., for about 5 minutes, etc.) until well blended. In a seventh step or operation, magnetic flakes may be slowly added while mixing (e.g., for about 30 minutes, etc.) until the magnetic flakes are well mixed and wetted with silicone polymer. In an eighth step or operation, the mixing may be continued (e.g., for about 10 minutes, etc.) until the mixture is thoroughly smooth. In a ninth step of operation, the resulting sheets may be cured in an oven (e.g., at 285 degrees Fahrenheit, etc.) for a predetermined amount of time depending on thickness (e.g., for about 6 hours or more for thicknesses of 0.1 inch to have a clean peel, etc.). Some additional steps that may occur before the curing process may include placing the mixture under vacuum (e.g., for about 5 minutes, etc.) to remove air, setting a gap between calendering rolls for desired product thickness, and rolling the mixture between two release liners in-between the calendering rolls.

In some exemplary embodiments, a thermally-conductive EMI absorber may further include an adhesive layer, such as a pressure-sensitive adhesive (PSA), etc. The pressure-sensitive adhesive (PSA) may be generally based on compounds including acrylic, silicone, rubber, and combinations thereof. The adhesive layer can be used to affix the thermally-conductive EMI absorbers to a portion of an EMI shield, such as to a single piece EMI shield, to a cover, lid, frame, or other portion of a multi-piece shield, to a discrete EMI shielding wall, etc. Alternative affixing methods can also be used such as, for example, mechanical fasteners. In other exemplary embodiments, the thermally-conductive EMI absorber may be tacky or self-adherent such that the thermally-conductive EMI absorber may be self-adhered to another surface without any adhesive layer.

In some embodiments, a thermally-conductive EMI absorber may be attached to a lid or cover of an EMI shield (e.g., a lid or cover of a single-piece EMI shield, a removable lid or cover of a multi-piece EMI shield, a lid or cover of an EMI shield from Laird Technologies, etc.). The thermally-conductive EMI absorber may be placed, for example, on an inner surface of the cover or lid. Alternatively, the thermally-conductive EMI absorber may be placed, for example, on an outer surface of the cover or lid. The thermally-conductive EMI absorber may be placed on an entire surface of the cover or lid or on less than an entire surface. For example, the thermally-conductive EMI absorber may be placed on a frame or base and a separate thermally-conductive EMI absorber may be placed on a removable lid or cover that is attachable to the frame or base. The thermally-conductive EMI absorber may be applied at virtually any location at which it would be desirable to have a thermally-conductive EMI absorber.

In exemplary embodiments, a thermally-conductive EMI absorber may be used to define or provide part of a thermally-conductive heat path from a heat source to a heat dissipating device or component. A thermally-conductive EMI absorber disclosed herein may be used, for example, to help conduct thermal energy (e.g., heat, etc.) away from a heat source of an electronic device (e.g., one or more heat generating components, central processing unit (CPU), die, semiconductor device, etc.). For example, a thermally-conductive EMI absorber may be positioned generally between a heat source and a heat dissipating device or component (e.g., a heat spreader, a heat sink, a heat pipe, a device exterior case or housing, etc.) to establish a thermal joint, interface, pathway, or thermally-conductive heat path along which heat may be transferred (e.g., conducted) from the heat source to the heat dissipating device. During operation, the thermally-conductive EMI absorber may then function to allow transfer (e.g., to conduct heat, etc.) of heat from the heat source along the thermally-conductive path to the heat dissipating device. The thermally-conductive EMI absorber may be used similarly to a thermal gap pad and allow for the elimination of a noise suppressor.

Example embodiments of thermally-conductive EMI absorbers disclosed herein may be used with a wide range of heat dissipation devices or components (e.g., a heat spreader, a heat sink, a heat pipe, a device exterior case or housing, etc.), heat-generating components, heat sources, heat sinks, and associated devices. For example, a heat source may comprise one or more heat generating components or devices (e.g., a CPU, die within underfill, semiconductor device, flip chip device, graphics processing unit (GPU), digital signal processor (DSP), multiprocessor system, integrated circuit, multi-core processor, etc.). Generally, a heat source may comprise any component or device that has a higher temperature than the thermally-conductive EMI absorber or otherwise provides or transfers heat to the thermally-conductive EMI absorber regardless of whether the heat is generated by the heat source or merely transferred through or via the heat source. By way of example only, exemplary applications include printed circuit boards, high frequency microprocessors, central processing units, graphics processing units, laptop computers, notebook computers, desktop personal computers, computer servers, thermal test stands, etc. Accordingly, aspects of the present disclosure should not be limited to use with any one specific type of heat-generating component, heat source, or associated device.

In some exemplary embodiments, the thermally-conductive EMI absorber may be configured to have sufficient conformability, compliability, and/or softness to allow the thermally-conductive EMI absorber to closely conform to a mating surface when placed in contact with the mating surface, including a non-flat, curved, or uneven mating surface. In some exemplary embodiments, the thermally-conductive EMI absorber has sufficient deformability, compliance, conformability, compressibility, and/or flexibility for allowing the thermally-conductive EMI absorber to relatively closely conform to the size and outer shape of an electronic component when placed in contact with the electronic component.

In some exemplary embodiments, the thermally-conductive EMI absorber is conformable even without undergoing a phase change or reflow. In other exemplary embodiments, the thermally-conductive EMI absorber may comprise a phase change material. In some exemplary embodiments, the thermally-conductive EMI absorber may comprise a non-phase change gap filler, gap pad, or putty that is conformable without having to melt or undergo a phase change.

The thermally-conductive EMI absorber may be able to adjust for tolerance or gaps by deflecting at low temperatures (e.g., room temperature of 20° C. to 25° C., etc.). By way of example, a thermally-conductive EMI absorbers may have a Young's modulus of less than or equal to about 300 pound force per square inch ($lpf/in^2$) or 2.1 megapascals (MPa). In exemplary embodiments, a thermally-conductive EMI absorber may have a Young's modulus that falls within a range from about 200 $lbf/in^2$ to about $300/in^2$ or from about 1.4 MPa to about 2.1 MPa. Also, by way of example, a thermally-conductive EMI absorbers may have a Shore 00 Hardness less than or equal to 60. In exemplary embodiments, a thermally-conductive EMI absorber may have a Shore 00 Hardness value that falls within a range from about 50 to about 60.

In some exemplary embodiments, the thermally-conductive EMI absorber may be conformable and have sufficient compressibility and flexibility for allowing the thermally-conductive EMI absorber to relatively closely conform to the size and outer shape of an electrical component when placed in contact with the electrical component. For example, a thermally-conductive EMI absorber may be along the inner surface of a cover of an EMI shield such that the thermally-conductive EMI absorber is compressed against the electrical component when the EMI shield is installed to a printed circuit board over the electrical component. By engaging the electrical component in this relatively close fitting and encapsulating manner, the thermally-conductive EMI absorber can conduct heat away from the electrical component to the cover in dissipating thermal energy.

In some embodiments, a thermally-conductive EMI absorber may be formed as a tape. The tape, for example, can be stored on a roll. In some embodiments, desired application shapes (e.g., rectangle, circle, ellipse, etc.) can be die-cut from the thermally-conductive EMI absorber, thereby yielding thermally-conductive EMI absorbers of any desired two-dimensional shape. Accordingly, the thermally-conductive EMI absorber can be die-cut to produce the desired outlines of an application shape.

In operation, a thermally-conductive EMI absorber according to exemplary embodiments disclosed herein may be operable for absorbing a portion of the EMI incident upon the EMI absorber, thereby reducing transmission of EMI therethrough over a range of operational frequencies (e.g., a frequency range from about 1 GHz to at least about 5 GHz, a frequency range from about 5 GHz to at least about 15 GHz, a frequency range from about 2 GHz to at least about 18 GHz, etc.). The EMI absorber may remove a portion of the EMI from the environment through power dissipation resulting from loss mechanisms. These loss mechanisms include polarization losses in a dielectric material and conductive, or ohmic, losses in a conductive material having a finite conductivity.

By way of background, EMI absorbers function to absorb electromagnetic energy (that is, EMI). EMI absorbers convert electromagnetic energy into another form of energy through a process commonly referred to as a loss. Electrical loss mechanisms include conductivity losses, dielectric losses, and magnetization losses. Conductivity losses refer to a reduction in EMI resulting from the conversion of electromagnetic energy into thermal energy. The electromagnetic energy induces currents that flow within an EMI absorber having a finite conductivity. The finite conductivity results in a portion of the induced current generating heat through a resistance. Dielectric losses refer to a reduction in EMI resulting from the conversion of electromagnetic energy into mechanical displacement of molecules within an absorber having a non-unitary relative dielectric constant. Magnetic losses refer to a reduction in EMI resulting from the conversion of electromagnetic energy into a realignment of magnetic moments within an EMI absorber.

Example embodiments are provided so that this disclosure will be thorough and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances. Or for example, the term "about" as used herein when modifying a quantity of an ingredient or reactant of the invention or employed refers to variation in the numerical quantity that can happen through typical measuring and handling procedures used, for example, when making concentrates or solutions in the real world through inadvertent error in these procedures; through differences in the manufacture, source, or purity of the ingredients employed to make the compositions or carry out the methods; and the like. The term "about" also encompasses amounts that differ due to different equilibrium conditions for a composition resulting from a particular initial mixture. Whether or not modified by the term "about", the claims include equivalents to the quantities.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A thermally-conductive electromagnetic interference (EMI) absorber comprising a matrix loaded with thermally-conductive particles, EMI absorbing particles, and silicon carbide, wherein the silicon carbide is present in a predetermined amount sufficient to synergistically enhance both thermal conductivity and EMI absorption, wherein the EMI absorbing particles comprise carbonyl iron, and the thermally-conductive particles comprise alumina;

wherein:
the thermally-conductive EMI absorber includes at least about 6 volume percent of the alumina, at least about 8 volume percent of the carbonyl iron, and at least about 21 volume percent of the silicon carbide; or the thermally-conductive EMI absorber includes about 2 to 4 volume percent of magnetic flakes, about 3 to 5 volume percent of the carbonyl iron, about 18 to 23 volume percent of the alumina, about 27 to 40 volume percent of manganese zinc ferrite, and about 4 to 10 volume percent of the silicon carbide.

2. The thermally-conductive EMI absorber of claim 1, wherein the thermally-conductive EMI absorber includes about 6 to 44 volume percent of the alumina, about 8 to 38 volume percent of the carbonyl iron, and about 21 to 27 volume percent of the silicon carbide.

3. The thermally-conductive EMI absorber of claim 1, wherein the matrix comprises a silicone elastomer matrix.

4. The thermally-conductive EMI absorber of claim 1, wherein the matrix comprises a silicone elastomer matrix loaded with the magnetic flakes, the carbonyl iron, the alumina, the manganese zinc ferrite, and the silicon carbide such that the thermally-conductive EMI absorber includes 2 to 4 volume percent of the magnetic flakes, 3 to 5 volume percent of the carbonyl iron, 18 to 23 volume percent of the alumina, 27 to 40 volume percent of the manganese zinc ferrite, and 4 to 10 volume percent of the silicon carbide.

5. The thermally-conductive EMI absorber of claim 1, wherein the matrix comprises a silicone elastomer matrix loaded with the carbonyl iron, the alumina, and the silicon carbide such that the thermally-conductive EMI absorber includes 6 to 44 volume percent of the alumina, 8 to 38 volume percent of the carbonyl iron, and 21 to 27 volume percent of the silicon carbide.

6. The thermally-conductive EMI absorber of claim 1, wherein the matrix comprises a silicone elastomer matrix loaded with the carbonyl iron, the alumina, and the silicon carbide such that the thermally-conductive EMI absorber includes at least 6 volume percent of the alumina, at least 8 volume percent of the carbonyl iron, and at least 21 volume percent of the silicon carbide.

7. The thermally-conductive EMI absorber of claim 1, wherein:
the thermally-conductive EMI absorber includes 43 volume percent of the alumina, 9 volume percent of the carbonyl iron, and 22 volume percent of the silicon carbide; and
the 22 volume percent of the silicon carbide is the predetermined amount sufficient to synergistically enhance both thermal conductivity and EMI absorption such that the thermally-conductive EMI absorber has better thermal conductivity and better absorption than a control absorber including 0 volume percent of silicon carbide, 22 volume percent of alumina, and 43 volume percent of carbonyl iron.

8. The thermally-conductive EMI absorber of claim 1, wherein:
the thermally-conductive EMI absorber includes about 7 volume percent of the alumina, about 37 volume percent of the carbonyl iron, about 26 volume percent of the silicon carbide, the thermally-conductive EMI absorber has a thermal conductivity of about 3 Watts per meter per Kelvin, and the thermally-conductive EMI absorber has an attenuation of at least about 9 decibels per centimeter at a frequency of at least 5 gigahertz and/or at least about 17 decibels per centimeter at a frequency of at least 15 gigahertz; or the thermally-conductive EMI absorber includes about 43 volume percent of the alumina, about 9 volume percent of the carbonyl iron, about 22 volume percent of the silicon carbide, the thermally-conductive EMI absorber has a thermal conductivity of about 4 Watts per meter per Kelvin, the thermally-conductive EMI absorber has an attenuation of at least about 9 decibels per centimeter at a frequency of at least 5 gigahertz and/or at least about 17 decibels per centimeter at a frequency of at least 15 gigahertz; or the thermally-conductive EMI absorber includes about 34 volume percent of the alumina, about 10 volume percent of the carbonyl iron, about 27 volume percent of the silicon carbide, the thermally-conductive EMI absorber has a thermal conductivity of about 3.5 Watts per meter per Kelvin, and the thermally-conductive EMI absorber has an attenuation of at least about 9 decibels per centimeter at a frequency of at least 5 gigahertz and/or at least about 17 decibels per centimeter at a frequency of at least 15 gigahertz.

9. The thermally-conductive EMI absorber of claim 1, wherein the thermally-conductive EMI absorber further comprises an adhesive layer for affixing the thermally-conductive EMI absorber to an inner surface of an EMI shield such that the thermally-conductive EMI absorber is compressible against a component on a printed circuit board when the EMI shield is installed to the printed circuit board over the component.

10. The thermally-conductive EMI absorber of claim 1, wherein the thermally-conductive EMI absorber includes about 3 volume percent of the magnetic flakes, about 4 volume percent of the carbonyl iron, about 19.5 volume percent of the alumina, about 32.1 volume percent of the manganese zinc ferrite, and about 4.8 volume percent of the silicon carbide.

11. The thermally-conductive EMI absorber of claim 1, wherein the thermally-conductive EMI absorber is configured to have a thermal conductivity of at least 2 Watts per meter per Kelvin, and an attenuation of at least about 9 decibels per centimeter for frequencies from 1 gigahertz to 6 gigahertz.

12. The thermally-conductive EMI absorber of claim 1, wherein:
the thermally-conductive particles further comprise one or more of zinc oxide, boron nitride, silicon nitride, aluminum, aluminum nitride, iron, metallic oxides, graphite, and a ceramic; and/or
the EMI absorbing particles further comprise ferrite; and/or
the thermally-conductive EMI absorber includes a crosslinker; and/or
the magnetic flakes comprise:
an alloy including iron, silicon, and aluminum; or
an alloy including iron and nickel.

13. A multi-piece EMI shield comprising a frame, a removable lid or cover attachable to and removable from the frame, and the thermally-conductive EMI absorber of claim 1 along an inner surface portion of the removable lid or cover of the multi-piece EMI shield, such that the thermally-conductive EMI absorber is compressed against a component on a printed circuit board when the multi-piece EMI shield is installed to the printed circuit board over the component.

14. The multi-piece EMI shield of claim 13, wherein the thermally-conductive EMI absorber further comprises an adhesive layer that affixes the thermally-conductive EMI absorber to the inner surface portion of the multi-piece EMI shield.

15. The multi-piece EMI shield of claim 13, wherein the thermally-conductive EMI absorber is self-adhered to the inner surface portion of the multi-piece EMI shield without an additional adhesive layer between the thermally-conductive EMI absorber and the inner surface portion of the multi-piece EMI shield.

16. The thermally-conductive EMI absorber of claim 1, wherein:
   the thermally-conductive EMI absorber is a gap pad having a thickness of at least 1 millimeter or putty that is conformable even without having to melt or undergo a phase change or reflow; and
   the thermally-conductive EMI absorber is configured to adjust for gaps by deflecting at room temperature within a range from 20° C. to 25° C.

17. The thermally-conductive EMI absorber of claim 1, wherein the thermally-conductive EMI absorber is a tacky self-adherent gap pad that is conformable even without having to melt or undergo a phase change or reflow.

18. A thermally-conductive electromagnetic interference (EMI) absorber comprising a matrix loaded with one or more thermal conductors, one or more EMI absorbers, magnetic flakes, manganese zinc ferrite, and silicon carbide, whereby the silicon carbide is present in a predetermined amount sufficient to generate a synergistic effect and enhance both thermal conductivity and EMI absorption of the thermally-conductive EMI absorber, and the thermally-conductive EMI absorber is configured to have a thermal conductivity of at least 2 Watts per meter per Kelvin and/or an attenuation of at least about 9 decibels per centimeter for frequencies from 1 gigahertz to 6 gigahertz, and wherein the thermally-conductive EMI absorber includes about 2 to 4 volume percent of the magnetic flakes, about 27 to 40 volume percent of the manganese zinc ferrite, and about 4 to 10 volume percent of the silicon carbide.

19. The thermally-conductive EMI absorber of claim 18, wherein:
   the one or more thermal conductors comprise alumina; and
   the one or more EMI absorbers comprise carbonyl iron.

20. The thermally-conductive EMI absorber of claim 19, wherein the matrix is loaded with the alumina, the carbonyl iron, the magnetic flakes, the manganese zinc ferrite, and the silicon carbide, such that the thermally-conductive EMI absorber includes about 2 to 4 volume percent of the magnetic flakes, about 3 to 5 volume percent of the carbonyl iron, about 18 to 23 volume percent of the alumina, about 27 to 40 volume percent of the manganese zinc ferrite, and about 4 to 10 volume percent of the silicon carbide.

21. The thermally-conductive EMI absorber of claim 18, wherein:
   the thermally-conductive EMI absorber is a gap pad having a thickness of at least 1 millimeter that is conformable even without having to melt or undergo a phase change or reflow; and/or
   the thermally-conductive EMI absorber is configured to adjust for gaps by deflecting at room temperature within a range from 20° C. to 25° C.; and/or
   the magnetic flakes comprise:
      an alloy including iron, silicon, and aluminum; or
      an alloy including iron and nickel.

22. A thermally-conductive electromagnetic interference (EMI) absorber comprising a matrix loaded with one or more thermally-conductive particles, one or more EMI absorbing particles, and silicon carbide, whereby the silicon carbide is present in a predetermined amount sufficient to generate a synergistic effect and enhance both thermal conductivity and EMI absorption of the thermally-conductive EMI absorber, wherein the thermally-conductive EMI absorber includes about 4 to 10 volume percent of the silicon carbide or about 21 to 27 volume percent of the silicon carbide.

23. The thermally-conductive EMI absorber of claim 22, wherein the thermally-conductive EMI absorber includes at least about 6 volume percent of the thermally-conductive particles, at least about 8 volume percent of the EMI absorbing particles, and at least about 21 volume percent of the silicon carbide.

24. The thermally-conductive EMI absorber of claim 23, wherein the thermally-conductive EMI absorber includes about 6 to 44 volume percent of the thermally-conductive particles, about 8 to 38 volume percent of the EMI absorbing particles, and about 21 to 27 volume percent of the silicon carbide.

25. The thermally-conductive EMI absorber of claim 22, wherein:
   the thermally-conductive particles comprise alumina;
   the EMI absorbing particles comprise carbonyl iron; and
   the thermally-conductive EMI absorber includes about 6 to 44 volume percent of the alumina, about 8 to 38 volume percent of the carbonyl iron, and about 21 to 27 volume percent of the silicon carbide.

26. The thermally-conductive EMI absorber of claim 22, wherein the thermally-conductive EMI absorber includes about 32 to 49 volume percent of the EMI absorbing particles, about 18 to 23 volume percent of the thermally-conductive particles, and about 4 to 10 volume percent of the silicon carbide.

27. The thermally-conductive EMI absorber of claim 22, wherein the thermally-conductive EMI absorber includes about 2 to 4 volume percent of magnetic flakes, about 3 to 5 volume percent of carbonyl iron, about 18 to 23 volume percent of alumina, about 27 to 40 volume percent of manganese zinc ferrite, and about 4 to 10 volume percent of the silicon carbide.

28. A method of enhancing thermal conductivity and electromagnetic interference (EMI) absorption of a thermally-conductive EMI absorber, the method comprising:
   predetermining an amount of silicon carbide, based on thermal conductivity and EMI absorbing properties of the silicon carbide, that is sufficient to synergistically enhance both thermal conductivity and EMI absorption of the thermally-conductive EMI absorber; and
   adding the predetermined amount of the silicon carbide to a matrix such that the matrix is loaded with thermally-conductive particles, EMI absorbing particles, and the predetermined amount of the silicon carbide to synergistically enhance both thermal conductivity and EMI absorption, wherein the thermally-conductive EMI absorber includes at least about 4 volume percent of the silicon carbide.

29. The method of claim 28, wherein the method includes adding the predetermined amount of silicon carbide to the matrix such that the thermally-conductive EMI absorber includes about 4 to 10 volume percent of the silicon carbide or about 21 to 27 volume percent of the silicon carbide.

30. The method of claim 28, wherein the method includes adding the thermally-conductive particles, the EMI absorbing particles, and the predetermined amount of the silicon carbide to the matrix such that:

the thermally-conductive EMI absorber includes about 32 to 49 volume percent of the EMI absorbing particles, about 18 to 23 volume percent of the thermally-conductive particles, and about 4 to 10 volume percent of the silicon carbide; or the thermally-conductive EMI absorber includes about 6 to 44 volume percent of the thermally-conductive particles, about 8 to 38 volume percent of the EMI absorbing particles, and about 21 to 27 volume percent of the silicon carbide.

31. The method of claim 28, wherein the method includes:

adding carbonyl iron, alumina, and the predetermined amount of the silicon carbide to the matrix such that the thermally-conductive EMI absorber includes about 6 to 44 volume percent of the alumina, about 8 to 38 volume percent of the carbonyl iron, and about 21 to 27 volume percent of the silicon carbide; or adding magnetic flakes, carbonyl iron, alumina, manganese zinc ferrite, and the predetermined amount of the silicon carbide to the matrix such that the thermally-conductive EMI absorber includes about 2 to 4 volume percent of the magnetic flakes, about 3 to 5 volume percent of the carbonyl iron, about 18 to 23 volume percent of the alumina, about 27 to 40 volume percent of manganese zinc ferrite, and about 4 to 10 volume percent of the silicon carbide.

\* \* \* \* \*